LOGARITHMIC ANALOG TO DIGITAL CONVERTER
Filed May 16, 1963
6 Sheets-Sheet 1
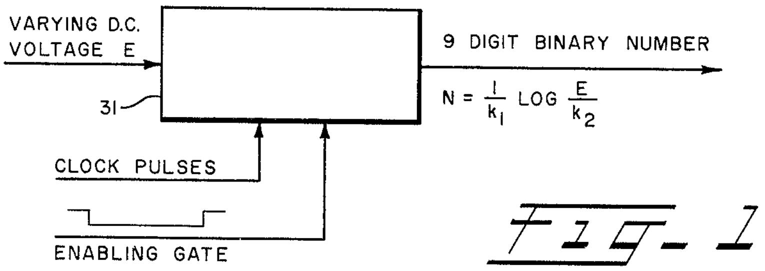
FIG. 1
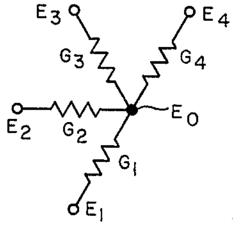
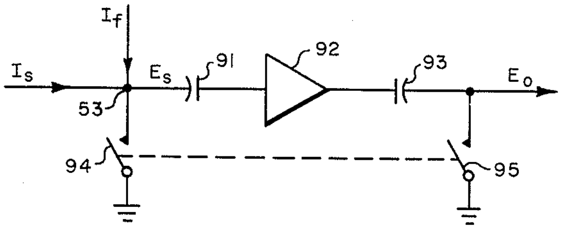
FIG. 4 FIG. 12
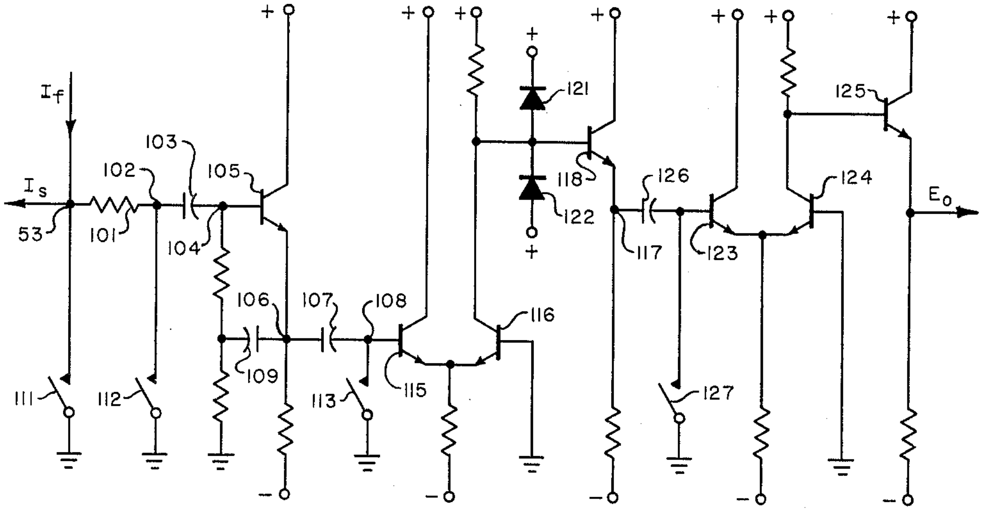
FIG. 13
INVENTOR.
JOHN W. GRAY
BY H. S. Mackey
ATTORNEY.

INVENTOR.
JOHN W. GRAY

BY H. A. Mackey

ATTORNEY.

March 8, 1966 J. W. GRAY 3,239,833

LOGARITHMIC ANALOG TO DIGITAL CONVERTER

Filed May 16, 1963 6 Sheets-Sheet 3

INVENTOR.
JOHN W. GRAY

BY H. S. Mackey

ATTORNEY.

March 8, 1966 J. W. GRAY 3,239,833
LOGARITHMIC ANALOG TO DIGITAL CONVERTER
Filed May 16, 1963 6 Sheets-Sheet 4

INVENTOR.
JOHN W. GRAY

BY H. L. Mackey

ATTORNEY.

March 8, 1966 J. W. GRAY 3,239,833

LOGARITHMIC ANALOG TO DIGITAL CONVERTER

Filed May 16, 1963 6 Sheets-Sheet 5

INVENTOR.
JOHN W. GRAY

BY H. A. Mackey

ATTORNEY.

March 8, 1966 J. W. GRAY 3,239,833

LOGARITHMIC ANALOG TO DIGITAL CONVERTER

Filed May 16, 1963 6 Sheets-Sheet 6

INVENTOR.
JOHN W. GRAY

BY H. L. Mackey

ATTORNEY.

3,239,833
LOGARITHMIC ANALOG TO DIGITAL CONVERTER

John W. Gray, Pleasantville, N.Y., assignor to General Precision, Inc., a corporation of Delaware
Filed May 16, 1963, Ser. No. 280,932
8 Claims. (Cl. 340—347)

This invention relates generally to analog to digital converters and particularly to such a converter which delivers a binary digital output indicative of a logarithmic function of an analog input quantity.

Many kinds of analog to digital converters are known which deliver a digital output which is a linear function of an analog input. In the solution of certain problems it becomes necessary to obtain a digital quantity representing a logarithmic function of an analog input. It would be possible to convert the analog input to a second analog quantity indicative of the logarithm of the input and then use a linear analog to digital converter to obtain the required output. However, when possible instrumentations of the analog to logarithmic analog operation are explored, it is found to be very difficult and expensive to perform the conversion with any great accuracy.

Another possibility would be to convert the input analog quantity to digital form by a linear converter and then derive a second digital quantity indicative of the specified logarithmic function of the first. But here it is found that the instrumentation of the digital to logarithmic digital operation is also complex and expensive.

The present invention is based on the discovery that it is possible to convert an analog quantity directly to a digital quantity representing a logarithmic function thereof with few, if any, components in excess of those required to perform a linear conversion.

It is a general object of the present invention to provide apparatus for generating a digital output indicative of a logarithmic function of an analog input quantity.

Another object is to perform an analog to logarithmic digital conversion in a single step.

Another object is to provide apparatus for performing the inverse operation; that is, for generating an analog quantity representing an exponential function of a digital input quantity.

Briefly stated, the binary digital output is generated by the method of successive approximations. In one embodiment requiring a nine digit output, nine flip-flops constituting a register are set successively by clock pulses, starting with the flip-flop representing the most significant digit. The flip-flops operate through associated circuitry to generate a current which is an exponential function of the number indicated by the register. As each flip-flop is set, the current so generated is compared with a reference current proportional to the analog voltage input, and the flip-flop is either reset or left set according to the result of the comparison.

More particularly, the current indicative of the exponential function of the number in the register is generated in two different ways. The three most significant flip-flops operate to select one of eight resistors each corresponding to one of the eight possible combinations of the first three digits. As each resistor is selected, it is connected to a voltage source which remains constant for the moment. The values of these resistors are chosen so that the current through each is proportional to an exponential function of the number indicated by the register. The last six flip-flops vary the voltage source in accordance with a close approximation to the desired exponential function. An important feature of the invention is the manner in which this close approximation is obtained.

For a clearer understanding of the invention, reference may be made to the following detailed description and the accompanying drawing, in which:

FIGURE 1 is a schematic diagram illustrating the function of the invention;

FIGURE 4 is a schematic diagram useful in explaining one of the principles used in the invention;

FIGURE 12 is a schematic diagram of one form of comparator amplifier; and

FIGURE 13 is a schematic diagram of another form of comparator amplifier.

Referring first to FIGURE 1, the entire analog to digital converter is represented by the block 31. The input is a unidirectional voltage E which may have any amplitude within predetermined limits. The output is a nine digit binary number N related to the input voltage by the formula $$N=\frac{1}{k_1}\log\frac{E}{k_2} \qquad (1)$$

This may also be written as $$E=k_2\epsilon^{k_1N} \qquad (2)$$

The converter also receives inputs comprising an enabling gate during which the converter operates and a train of clock pulses which control this operation.

Figure 2:
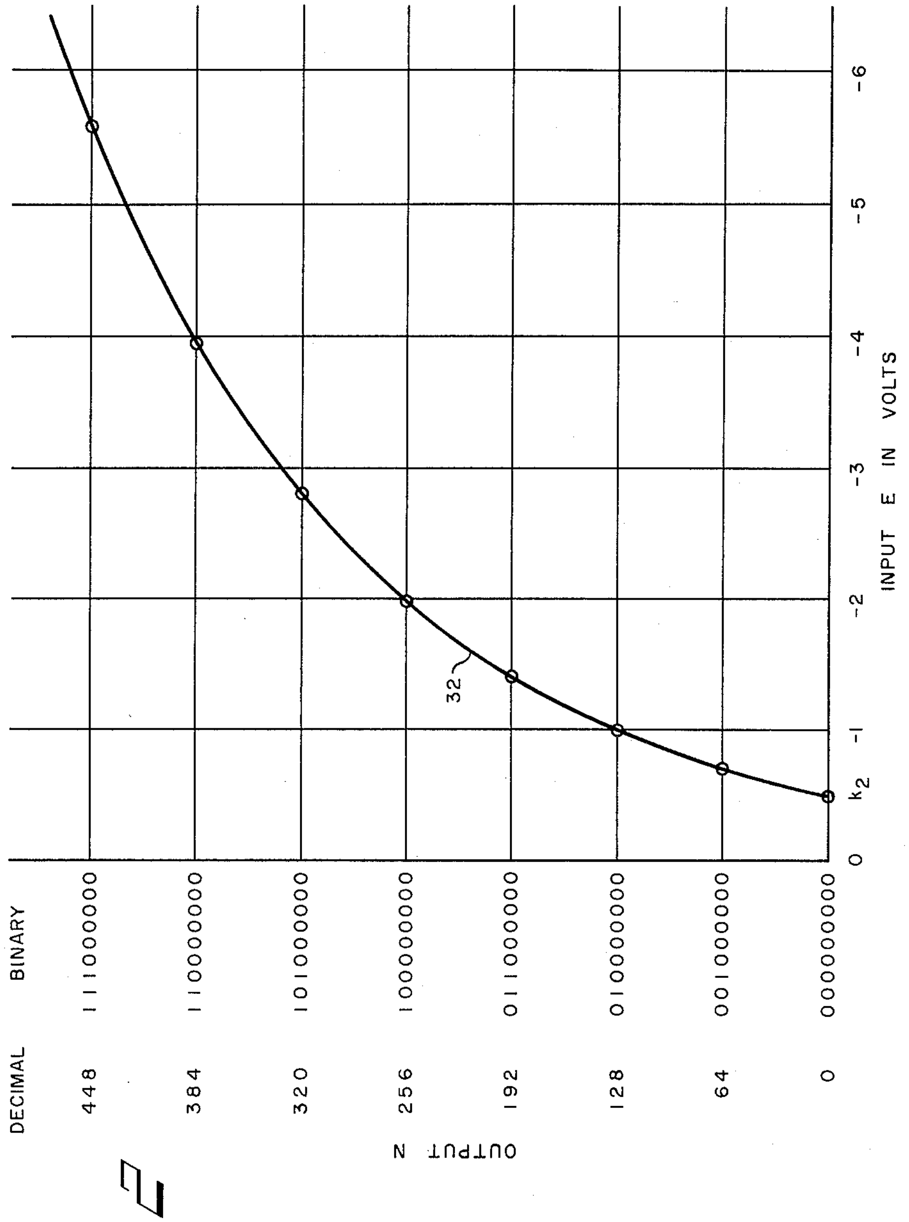
FIGURE 2 is a graph useful in explaining the invention.

FIGURE 2 shows graphically the desired relationship between the input voltage and the digital output. The output is zero when $E=k_2$ and increases as the input voltage increases. Also shown are eight particular points on the curve 32 corresponding to the eight possible combinations of the first three digits of the output.

Figure 3:
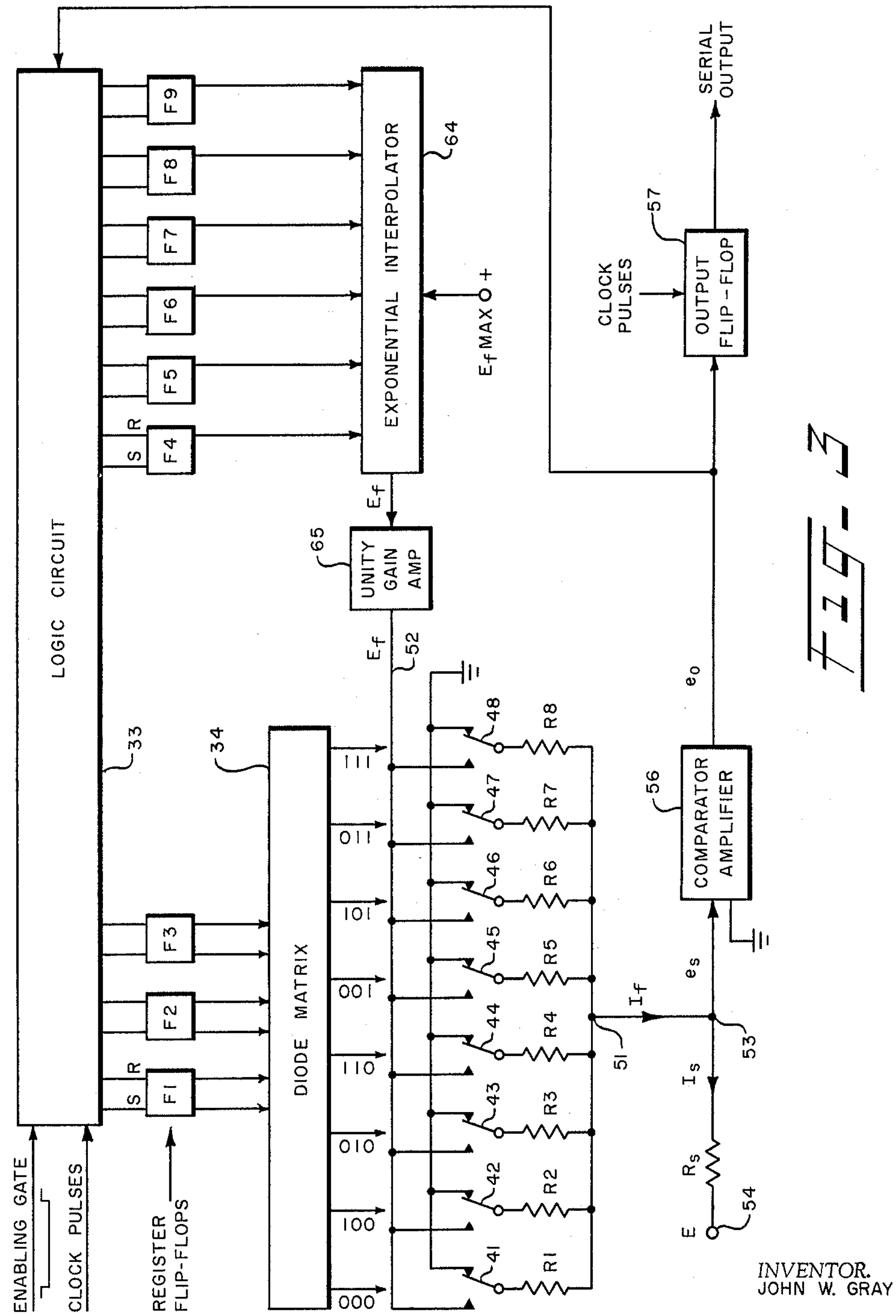
FIGURE 3 is a schematic block diagram of the invention.

Referring now to FIGURE 3, there are shown nine register flip-flops, F1 through F9, which generate the output one digit at a time starting with F1 which represents the most significant digit and proceeding sequentially to F9 which represents the least significant digit. The previously mentioned enabling gate and clock pulses are applied to a logic circuit 33 which controls the nine flip-flops. The outputs of the first three flip-flops are led to a diode matrix 34 which, under control of the flip-flop outputs, controls the operation of eight two-position switches 41 to 48, inclusive. These switches are preferably transistor switches but have been shown schematically as if they were mechanical switches.

Eight resistors R1 to R8, inclusive, each have one terminal connected to a common junction 51. The eight switches each connect the other terminal of one of the resistors either to ground or to a conductor 52 which has a voltage $E_f$ impressed thereon. If the switches were mechanical switches, the ground connections would be unnecessary, but with transistor switches it is preferred to ground the unused resistors to prevent unwanted current from leaking through the ostensibly open transistors and their associated resistors to the junction 51.

For the moment it is assumed that the voltage $E_f$ is constant. The switches are normally in the positions shown with all of the resistors grounded. The diode matrix 34 receives a signal representing one of the eight possible binary numbers from the flip-flops F1, F2 and F3 and in response thereto actuates one of the switches 41–48 so as to connect one resistor to the conductor 52. The switch 41 and the resistor R1 corresponds to the lowest binary number, that is, 000, and the remaining switches and resistors correspond to increasing numbers from left to right, as shown, the switch 48 and the resistor R8 corresponding to the largest number, 111. Only one resistor is ever connected to the conductor 52 at any one time.

The common junction 51 is connected to a summing point 53 where the current through the selected resistor is compared with the current through a standard resistor $R_s$ connected to the input voltage. The analog input voltage is negative and is connected to the terminal 54 which in turn is connected through the resistor $R_s$ of known value to the summing point 53. The value of each of the resistors 41–48 is selected to make the potential of the summing point zero when the input voltage E has the value, as indicated by the graph of FIGURE 2, corresponding to the binary number from the matrix 34 which selected that resistor.

It is a well-known principle that the voltage of a summing point is equal to the summation of each branch input voltage times its conductance divided by the total conductance. As shown in FIGURE 4, $$E_0=\frac{E_1G_1+E_2G_2+E_3G_3+\text{etc.}}{G_1+G_2+G_3\text{ etc.}} \qquad (3)$$

where $E_1$, $E_2$ etc. are voltages applied to the various branches and $G_1$, $G_2$ etc. are the respective conductances. In the present case there are nine branches, the resistors R1–R8 and the resistor $R_s$. At any one time, seven of these are connected to ground, or zero potential, while $R_s$ is connected to E and one of the resistors R1–R8 is connected to $E_f$. Accordingly, when the potential of the summing point 53 is zero, $$\frac{E_f}{R}=\frac{E}{R_s} \qquad (4)$$

where R represents one of the resistors R1–R8.

The ratios in Equation 4 obviously represents the currents which would flow through R and $R_s$, respectively, if the summing point 53 were connected to ground, and it is convenient to speak of the current $I_f$ from the junction 51 to the summing point 53 and of the current $I_s$ through the resistor $R_s$ as is they were distinct, even though they are in reality the same.

The current through the resistor $R_s$, or, more correctly, the ratio $E/R_s$, is calculated for those values of E which correspond to the eight binary numbers representing the first three digits of a nine digit number. These currents, or ratios, are calculated from Equation 2 assuming that the values of $k_1$ and $k_2$ are known for the particular problem, and are the values indicated by the eight points shown on the curve of FIGURE 4. The values of each of the resistors R1 to R8 may now be calculated from Equation 4, assuming $E_f$ has been selected.

The summing point 53 is connected to the input of a comparator amplifier 56, about which more will be said later. For the present it is sufficient to note that it is required to deliver a substantial output when and only when the potential of the summing point rises above ground. It is necessary that the amplifier 56 have a very high input impedance compared to that of the other circuits connected to the summing point 53 in order to avoid loading these circuits. The output $e_o$ of the amplifier is connected to the logic circuit 33 and assists in controlling the register flip-flops F1 through F9, and is also connected to the input of a flip-flop 57 which provides a serial output.

Figure 5:
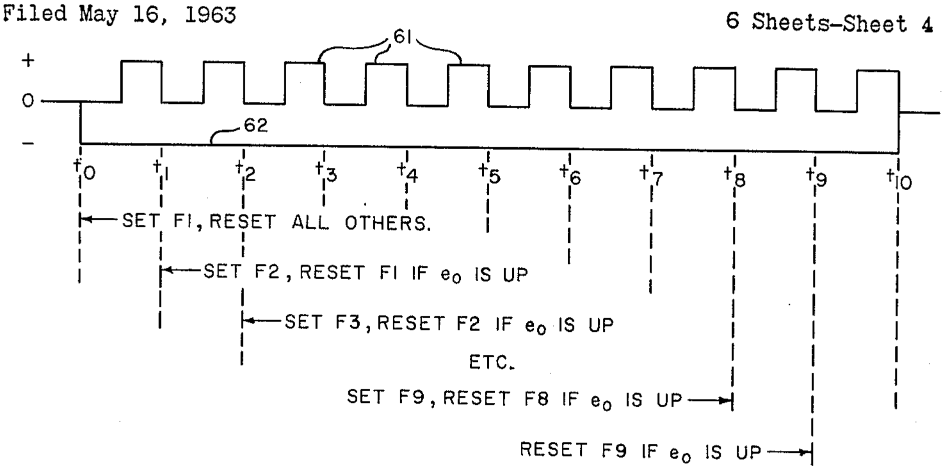
FIGURE 5 is a timing diagram illustrating the sequence of operations.

Referring now to FIGURE 5, the timing diagram, there are shown the clock pulses 61 and the enabling gate 62. The time corresponding to the start of the enabling gate 62 is designated $t_0$ and the times correponding to the trailing edges of the clock pulses 61 are designated $t_1$, $t_2$, etc. At the time $t_0$, F1 is "set" so that its output represents the digit 1, and F2 through F9 are "reset" to zero. The binary number 100 is passed to the diode matrix 34 which actuates the switch 45 thereby connecting the resistor R5 to the conductor 52. If the current $I_f$ is too large, the potential of the summing point 53 will rise, and the output $e_o$ of the amplifier 56 will rise, delivering a signal to the logic circuit 33. If the current $I_f$ is too small, no signal is delivered. This amounts to comparing the binary number 100000000 with the input voltage to see whether it is too large or too small.

At the time $t_1$, the flip-flop F2 is set. If there is no signal from the amplifier 56, F1 is allowed to remain in its set condition, and the number 110 is passed to the diode matrix 34. However, if there is a signal from the amplifier 56, F1 is reset, thereby passing the number 010 to the diode matrix. Assuming the latter for illustration, the resistor R3 is substituted for the resistor R5 and a new comparison is made. This amounts to trying the binary number 010000000 to see whether it is too large or too small.

At the time $t_2$, F3 is set and, if $e_o$ is up, F2 is reset, but if $e_o$ is not up, F2 remains set. Assuming the latter, the number 011 is passed to the diode matrix and the resistor R4 substituted for the resistor R3.

At the time $t_3$, the flip-flop F4 is set, but consideration of the effect of this will be deferred. F3 remains set or is reset in accordance with the result of the previous comparison.

After the operations of time $t_3$ have been performed, the first three digits of the binary number have been determined. These operations amount to trying various binary numbers, starting in approximately the middle of the range, then proceeding halfway on one side or the other until one of the eight points designated on the curve of FIGURE 2 has been selected. Assuming that the digits 011 have been selected, it is known that the final number will be at least as large as 011000000 but less than 100000000.

It would be possible to select the remaining six digits in the same way but this would require a total of 512 resistors and 512 two-way switches.

It is possible to vary the current $I_f$ flowing to the summing point by varying the applied voltage, $E_f$. The voltage could be varied as a linear function of the binary number applied by various arrangements, one example being the network suggested in the Gray Patent No. 2,738,504. Such variation would amount to interpolating linearly between the three digit number so far selected and the next. While linear interpolation may be sufficiently accurate in some cases, other cases require greater accuracy.

The present invention employs an exponential interpolator 64 by means of which the flip-flops F4 through F9 vary the voltage $E_f$ in an approximately exponential manner. The flip-flops F4 through F9 are operated by the logic circuit 33 under control of the enabling gate, the clock pulses, and the output $e_o$ of the comparator amplifier 56 in exactly the same way as previously explained for F1, F2 and F3. The outjut voltage $E_f$ of the interpolator is passed through a unity gain amplifier 65 so as to avoid loading the interpolator circuits.

Ideally, the voltage $E_f$ should vary in accordance with the equation $$E_f=E_{max}\epsilon^x \qquad (5)$$

where $x$ is linearly related to the six digit binary input member. An important feature of the present invention resides in a circuit using comparatively few resistors and switches by which a very close approximation to Equation 5 is obtained.

Figure 6:
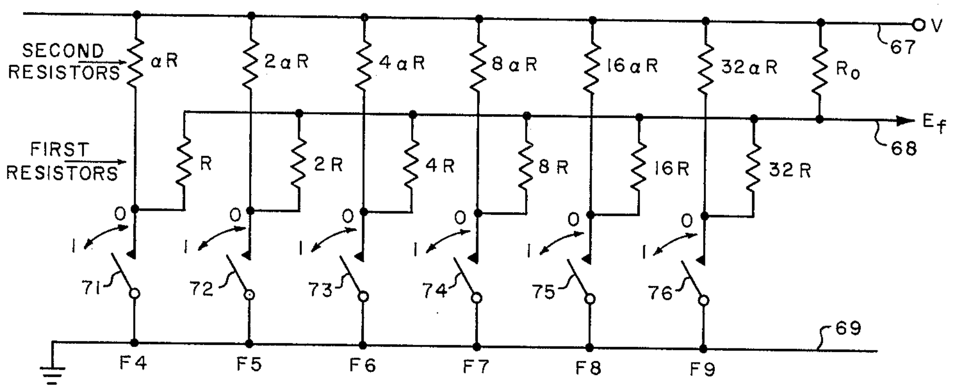
FIGURE 6 is a schematic diagram of the exponential interpolator.

Referring now to FIGURE 6, there is shown a supply conductor 67 connected to a source of positive voltage V, an output conductor 68, and a ground conductor 69. A series of conductive paths are connected in parallel with each other between the output conductor 68 and the supply conductor 67. Each path comprises first and second resistors serially connected in that order between the output conductor 68 and the supply conductor 67. As shown, the group of first resistors comprises the eight resistors R, 2R, 4R, 8R, 16R and 32R, the resistance values of which increase in the order named in a geometric progression the multiplication factor of which is two. The group of second resistors comprises the eight resistors $\alpha$R, 2$\alpha$R, 4$\alpha$R, 8$\alpha$R, 16$\alpha$R and 32$\alpha$R, the resistance value of which also increase in the order named in a geometric progression the multiplication factor of which is also two. The resistance of each resistor in the second group is related to the resistance of the corresponding resistor in the first group by the same factor $\alpha$. The single resistor $R_0$ is connected between the output conductor 68 and the supply conductor 67.

Six switches, 71 to 76, inclusive, are arranged to selectively ground the junctions between the first and second resistors of each path. These switches preferably are transistor switches but are shown schematically in FIGURE 6 as if they were mechanical switches. The switches 7176 are operated by the previously mentioned flip-flops F4 to F9 inclusive, each switch being closed when the corresponding flip-flop indicates the number 0 and each being open as shown in FIGURE 6 when the corresponding flip-flop indicates the number 1.

Figure 7:
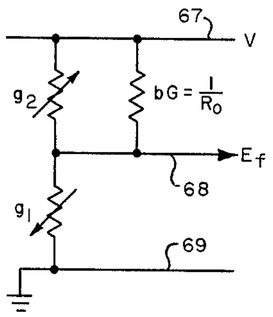
FIGURE 7 is a simplified conductance diagram of the circuit of FIGURE 6.

FIGURE 7 shows a simplified equivalent conductance network. The conductance $g_1$ is the parallel conductance of those first resistors (R, 2R, etc.) whose switches are closed by "zeros." It is noted that the second resistors ($\alpha$R, 2$\alpha$R etc.) whose switches are closed are merely connected across the supply and therefore have no effect on the output voltage. The conductance $g_2$ is the parallel conductance of the sums of those first and second resistors whose switches are opened by "ones." From FIGURE 7, the output voltage may be expressed as $$E_f=V\frac{bG+g_2}{bG+g_2+g_1} \quad (6)$$

where $$bG=\frac{1}{R_0}$$

When all of the switches are closed due to an input number comprising all zeros, $g_1$ is a maximum and is the conductance of all of the first resistors (R, 2R etc.) in parallel. Let us designate this conductance as G. At this time $g_2$ is zero. In the absence of $R_0$, that is, if $b$ in Equation 6 were zero, the output voltage would be zero. The inclusion of the resistor $R_0$ allows a minimum voltage other than zero to be selected.

When all of the switches are open due to an input number comprising all "ones," $g_1$ is zero while $g_2$ is a maximum which maximum is the conductance of the parallel combination of each first resistor in series with the corresponding second resistor. This maximum is obviously less than G, and is denoted $c$G. It can easily be shown that $$c=\frac{1}{1+\alpha} \quad (7)$$

Figure 8:
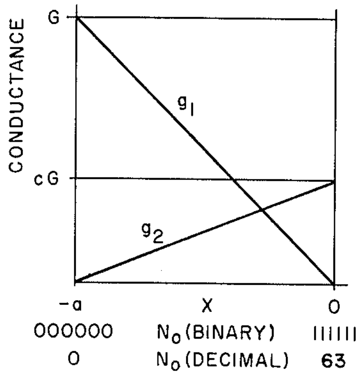
FIGURES 8, 9 and 10 are graphs useful in explaining the invention.

Each of the conductances $g_1$ and $g_2$ varies linearly (or, more accurately, in sixty-three steps) with the input, as shown in FIGURE 8. The number $N_0$ designates the number indicated by the flip-flops F4 to Fg, that is, the last six digits, as distinguished from the entire nine digit number N. It is convenient to establish the variable $x$, linearly related to the input number $N_0$ by the equation $$x=\frac{a(N_0-63)}{63} \quad (8)$$

so that as $N_0$ goes from zero to sixty-three, $x$ goes from $-a$ to zero. From FIGURE 8, $$g_1=-\frac{Gx}{a} \quad (9$$

$$g_2=cG+\frac{cGx}{a} \quad (10)$$

Substituting Equations 9 and 10 into Equation 6 it is found that $$E_f=V\frac{1+K_1x}{1-K_2x} \quad (11)$$

where $$K_1=\frac{c}{a(b+c)} \quad (12)$$

$$K_2=\frac{1-c}{a(b+c)} \quad (13)$$

Equations 12 and 13 yield $$b=\frac{1-aK_1}{a(K_1+K_2)} \quad (14)$$

$$c=\frac{K_1}{K_1+K_2} \quad (15)$$

From Equations 7 and 15

$$\alpha=\frac{K_2}{K_1} \quad (16)$$

Consider Equation 11 when $K_1=K_2=\frac{1}{2}$. The fractional expression may be written as $$\frac{1+\frac{x}{2}}{1-\frac{x}{2}}=1+x+\frac{x^2}{2}+\frac{x^3}{4}+\cdots\frac{x^n}{2^{n-1}} \quad (17)$$

This is a close approximation to the expansion of $\epsilon^x$, which is $$\epsilon^x=1+x+\frac{x^2}{2}+\frac{x^3}{6}+\cdots\frac{x^n}{n!}$$

It would be possible to construct an exponential interpolator using $K_1=K_2=\frac{1}{2}$, in which case $\alpha=1$ and each resistor in the upper row of FIGURE 6 would have the same value as the corresponding resistor in the lower row, and such an interpolator would be much more accurate than a linear interpolator. However, for any particular range of values of $x$, it is possible to select values for $K_1$ and $K_2$ which produce a better approximation. $K_1$ and $K_2$ may be selected by a little experimental mathematics which can best be illustrated by a specific example.

Consider the specific example wherein it is required that the converter accept an input voltage, E, ranging from −0.5 volt to −6.0 volts and generate a nine digit binary number, N, according to the formula $$N=\frac{461\log(-2E)}{\log 12} \quad (19)$$

This may be rewritten as $$-2E=\epsilon^{0.00539024N} \quad (20)$$

The eight values of E corresponding to the eight possible combinations of the first three digits of N are computed and are given in Table 1 below.

Table 1

| N | | E in volts |
|---|---|---|
| Binary | Decimal | |
| 000000000 | 0 | −0.50000 |
| 001000000 | 64 | −0.70591 |
| 010000000 | 128 | −0.99662 |
| 011000000 | 192 | −1.40706 |
| 100000000 | 256 | −1.98652 |
| 101000000 | 320 | −2,80462 |
| 110000000 | 384 | −3.95963 |
| 111000000 | 448 | −5,59166 |

The curve 32 of FIGURE 2 is plotted from Table 1.

From FIGURE 3, it is obvious that, when the potential of the summing point 53 is zero, the current $I_s$ through the resistor $R_s$ is directly proportional to E and that the desired current $I_f$, being equal to $I_s$, is also proportional to E. Therefore, the curve 32 of FIGURE 2 can represent, to an appropriate scale, the desired current $I_f$ as a function of the number N.

Figure 9:
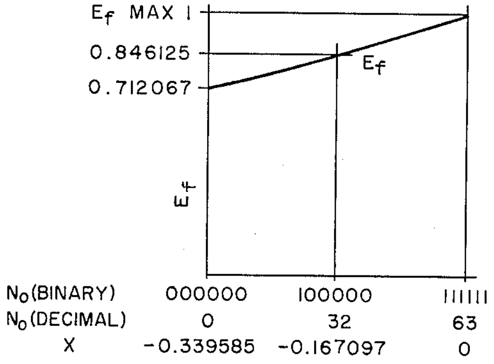

As previously mentioned, $I_f$ can be varied by changing the applied voltage $E_f$. After the first three digits have been determined, one of the eight resistors R1–R8 will have been selected and thereafter $E_f$ is directly proportional to $I_f$. In the region between may of the eight points on the curve 32 of FIGURE 2, this curve can be regarded as representing, to an appropriate scale, the desired value of $E_f$ as a function of the number N. We are interested at present in varying $E_f$ so as to extend the curve 32 upward from any one of the eight points toward the next point one bit at a time for a total of sixty-three bits. For explanation it is convenient to redraw a portion of the curve 32 of FIGURE 2 to an enlarged scale with the number as the abscissa and $E_f$ as the ordinate. Such a curve is shown in FIGURE 9. designating the maximum value as $E_{f\ max}$ and the last six digits of the number as $N_0$, ideally $E_f$ should vary according to the equation $$E_f = E_{f\ max}\,\epsilon^{0.00539024N_0} \tag{21}$$

Equation 21 may be written as $$E_f = E_{f\ max}\,\epsilon^{x} \tag{22}$$

where $$x = 0.00539024(N_0 - 63) \tag{23}$$

or $$x = \frac{0.339585(N_0 - 63)}{63} \tag{24}$$

For this specific case, then, the value of $a$, FIGURE 8, is 0.339585.

Figure 10:
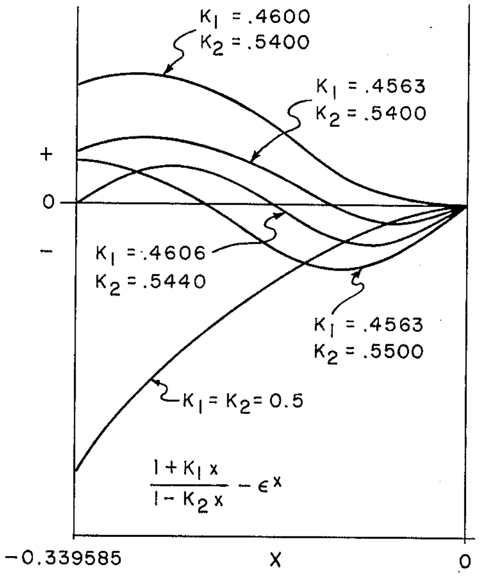

Since $x$ varies from −0.339585 to zero, we can compare $$\frac{1+K_1x}{1-K_2x}$$

with $\epsilon^x$ over this range for various values of $K_1$ and $K_2$ so as to minimize the error. FIGURE 10 shows the results of several comparisons and was obtained by plotting $$\frac{1+K_1x}{1-K_2x} - \epsilon^x$$

as a function of $x$ for various values of $K_1$ and $K_2$.

When $K_1 = K_2 = 0.5$, the error is zero when $x$ is zero and increases steadily in the negative direction as $x$ becomes more negative. When $K_1 = 0.4600$ and $K_2 = 0.5400$, the error increases in the positive direction as $x$ becomes more negative and remains positive throughout the range of interest. It is to be noted that both of these curves are tangent to the zero error line at $x=0$, as are all curves when $K_1 + K_2 = 1$.

When $K_1 = 0.4563$ and $K_2 = 0.5400$, the error first is negative, then zero, then positive as $x$ becomes more negative. The curve for $K_1 = 0.4563$, $K_2 = 0.5500$ is similar, but crosses the zero axis at a different point. Finally, the curve for $K_1 = 0.4606$, $K_2 = 0.5440$ passes through zero when $x=0$, when $x$=approximately 0.339585, and when $x$ is approximately halfway between. More important, the maximum positive and negative errors are approximately the same, each being approximately 0.0002, which is less than the maximum error of any of the curves previously discussed. Accordingly, the values of $K_1 = 0.4606$ and $K_2 = 0.5440$ were selected for the present embodiment of the invention.

It is to be noted that when $x=0$ the error is zero for all values of $K_1$ and $K_2$ and that, when $K_1 + K_2 \neq 1$, as in three of the curves of FIGURE 10, the error curves cross the zero axis twice (or would if the curves were extended). It therefore appears that $K_1$ and $K_2$ can be selected to make the error zero at two values of $x$ in addition to $x=0$, and that these two values of $x$ depend upon $K_1$ and $K_2$. Additionally it appears that the maximum error will be a minimum when the first axis crossing is approximately midway between zero and the second axis crossing. Therefore it is possible to determine analytically those values of $K_1$ and $K_2$ which make the error zero at any two values of $x$ in addition to zero. Also, if the first selected value of $x$ is approximately one half the second, the maximum error throughout the range will be approximately as small as possible.

Consider the general case where it is desired to make the error zero at two values of $x$, say $x=a_1$ and $x=a_2$. The desired values, that is $\epsilon^{a_1}$ and $\epsilon^{a_2}$, can be determined from published tables. Let these values be designated $p$ and $q$ respectively. We can then write $$p = \frac{1+K_1a_1}{1-K_2a_1} \tag{25}$$

and $$q = \frac{1+K_1a_2}{1-K_2a_2} \tag{26}$$

Solving these equations for $K_1$ and $K_2$ there is obtained $$K_1 = \frac{a_2pq - a_2q - a_1pq + a_1p}{a_1a_2(q-p)} \tag{27}$$

and $$K_2 = \frac{a_1q - a_1 - a_2p + a_2}{a_1a_2(q-p)} \tag{28}$$

$K_1$ and $K_2$ may then be determined from the known values of $a_1$, $a_2$, $p$ and $q$.

It is often desired to make the error substantially zero at the maximum value of $x$ and at one half the maximum. In this case $a_2 = a_1/2$ and Equations 27 and 28 become $$K_1 = \frac{2p - pq - q}{a_1(q-p)} \tag{29}$$

and $$K_2 = \frac{2q - p - 1}{a_1(q-p)} \tag{30}$$

Having determined the values of $K_1$ and $K_2$ as 0.4606 and 0.5440 respectively and the value of $a$ as 0.339585, let us consider the determination of the remaining parameters of the specific example. From Equation 14, $b=2.47275$ and from Equation 16, $\alpha=1.18107$.

As previously noted, G is the conductance of all of the first resistors (R, 2R etc.) in parallel and is equal to $$\frac{1.96875}{R}$$

The loading resistor $R_0$ is equal to $$\frac{1}{bG}$$

or 0.205414R.

Figure 11:
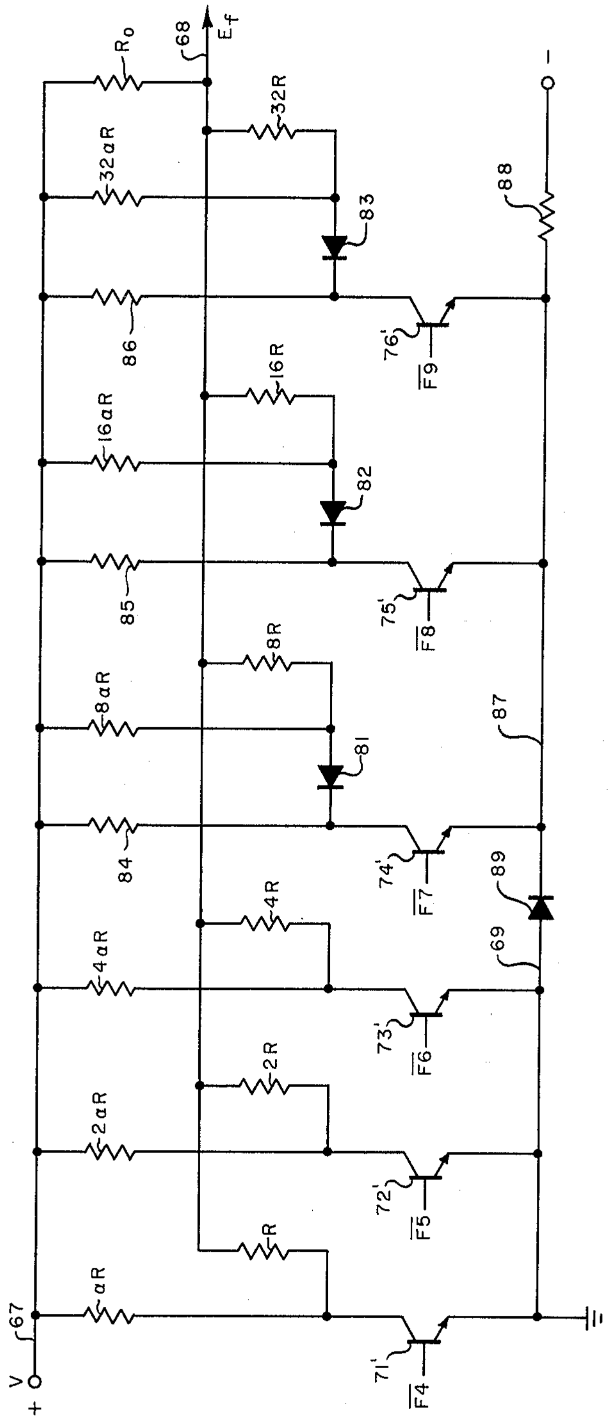
FIGURE 11 is a schematic diagram of the exponential interpolator showing details in addition to those shown in FIGURE 6.

FIGURE 11 shows the actual circuit of the exponential interpolator. A value of 15 volts was selected for $E_{f\ max}$ and a value of 10K ohms for R. This makes the loading resistor, $R_0$, 2.054K ohms. This circuit is similar to that shown in FIGURE 6 but some details have been added. The switches 71–76 are actually transistors 71'–76', and their use makes certain modifications desirable.

First, the values of the resistor R, 2R and 4R are decreased from the computed values of 10K, 20K and 40K ohms by about 20 ohms to allow for the small collector-emitter potential difference when the transistors are conducting. This allowance makes the values 9.98K, 19.98K and 39.98K ohms respectively. In the last three stages, such changes would be too small to be significant so that resistors 8R, 16R and 32R are simply 80K, 160K and 320K ohms respectively.

Each of the second resistors ($\alpha$R, 2$\alpha$R etc.) should normally be $\alpha$ times the corresponding first resistor (R, 2R etc.). However, the above mentioned decrease of about 20 ohms in the first resistors makes a slight modification desirable. The second resistors ($\alpha$R, 2$\alpha$R etc.) have no effect when the transistor switches are closed because they are merely connected across the power supply. But when the switches are open, the series combination between the supply conductor 67 and the output conductor 68 should be the sum of calculated values of R+$\alpha$R, 2R+2$\alpha$R, etc. In the case of R and $\alpha$R, the sum should be 10K+$\alpha$10K or 10K+11.81K or 21.81K ohms. But since R is 9.98K ohms, $\alpha$R is modified slightly to be 21.81K minus 9.98K or 11.83K ohms. Similarly, 2$\alpha$R is 23.63K ohms and 4$\alpha$R is 47.26K ohms. The remaining second resistors are simply $\alpha$ times the corresponding first resistor, or 94.5K, 189K, and 378K ohms respectively.

Second, in the last three stages the values of 8$\alpha$R, 16$\alpha$R and 32$\alpha$R would make the collector load resistances very high, resulting in slow operation when the transistors are opened, due to collector capacitance. Accordingly, the diodes 81, 82 and 83 have their anodes connected to the junctions of resistors 8R and 8$\alpha$R, 16R and 16$\alpha$R, and 32R and 32$\alpha$R, respectively while the cathodes are connected to the collectors of the transistors 74', 75' and 76' respectively. Resistors 84, 85 and 86 each of about 47K ohms are connected between the collectors of the transistors 74', 75' and 76' respectively and the positive supply conductor 67 to constitute collector load resistors. It is to be noted that when the transistors are nonconductive, the diodes 81, 82 and 83 isolate the resistors 84, 85 and 86, while when the transistors are conductive, the resistors 84, 85 and 86 are merely connected between the supply conductor 67 and ground and therefore have no effect on the output voltage.

Third, there is a small potential drop across the diodes 81, 82 and 83 when they are conducting and to compensate for this, the emitters of the transistors 74', 75' and 76' are connected to a conductor 87. This conductor is connected through a resistor 88 to a source of negative potential and is also connected to the cathode of a diode 89 the anode of which is connected to the ground conductor 69. The diode 89 is the same type as the diodes 81, 82 and 83 so that the current drawn therethrough maintains the potential of the conductor 87 below ground potential by substantially the same amount as the drop across each of the diodes 81, 82 and 83.

As previously mentioned, a value of +15 volts was selected for V, FIGURES 6 and 11, which makes $E_{f\,max}$ also equal 15 volts. From Equation 11, $$E_f = V\frac{1+K_1x}{1-K_1x}$$

setting $x=0.339585$ (or from Equation 22, $E_f=E_{f\,max}\epsilon^x$, since the error is zero for this value of $x$) it is found that $E_{f\,min}=10.6809$ volts. This is the value of $E_f$ which is applied to the resistors R1–R8 of FIGURE 3 when the first three digits are being selected.

In FIGURE 3, a value of 10K ohms was selected for $R_s$. The values of the resistors R1–R8 may now be calculated from Equation 4, which is repeated for convenience.

$$\frac{E_f}{R}=\frac{E}{R_s} \tag{4}$$

In solving for R, $E_f$ is 10.6809 volts, $R_s$ is 10K ohms, and E has the values set forth in Table 1. The values of R1–R8 as calculated are shown in Table 2 below.

*Table 2*

| First Three Digits of N | Resistor | Resistance, K ohms |
|---|---|---|
| 000 | R1 | 213.618 |
| 001 | R2 | 151.306 |
| 010 | R3 | 107.171 |
| 011 | R4 | 75.909 |
| 100 | R5 | 53.767 |
| 101 | R6 | 38.083 |
| 110 | R7 | 26.9745 |
| 111 | R8 | 19.1060 |

As in the case of the resistors in the exponential interpolator, these resistors should be reduced slightly (by about 20 ohms) from the calculated values to allow for the small collector-emitter potential difference when the transistors are conducting.

The comparator amplifier 56, FIGURE 3, is required to determine whether the potential of the summing point is above ground potential. As previously mentioned, the amplifier should have a high input impedance and high gain so that it can respond to small potential differences.

FIGURE 12 illustrates one circuit which can be used. The summing point 53 is connected through a capacitor 91 to a high gain amplifier 92 the output of which is coupled by another capacitor 93 to the output conductor. Switches 94 and 95 are arranged to ground the summing point 53 and the output conductor respectively when closed. These switches are preferably transistor switches and are operated simultaneously by the clock pulses.

Referring to the timing diagram, FIGURE 5, the switches 94 and 95 are closed when the clock potential is zero and are opened during each positive clock pulse interval. At the time $t_0$, both switches are closed and F1 is set, thereby connecting the resistor R5 into the circuit. If $I_f$ is larger than $I_s$, then when the clock pulse train goes positive, the switches 94 and 95 are opened, and $e_s$ and $e_o$ rise. At time $t_1$, F2 is set, F1 is reset because $e_o$ has risen in potential, and the switches 94 and 95 are closed to prepare for the next comparison. At a time between $t_1$ and $t_2$, when the clock pulse goes positive, the switches 94 and 95 are opened and the next comparison made. The process continues in the same fashion.

A comparator amplifier circuit as above described operates satisfactorily provided the frequency of the clock pulses is not too high. If, for example, the frequency is 200 kcps, each clock period is 5 $\mu$sec. From the time $t_0$ until the first rise in clock potential, there are only 2½ $\mu$sec. during which time F1 is set, the diode matrix 34 must operate, and the transistor switch 45 must be closed. Then in the next 2½ $\mu$sec. the switches 94 and 95 must open, the comparison must be made, and the signal passed to the logic circuit in time for the setting of F2 at time $t_1$. The cycle must then be repeated. It is apparent that even though transistor switches are available which are quite fast, operation at such a frequency is marginal. Accordingly, it is preferred to use a comparator amplifier which does not require switching between comparisons. Such an amplifier relieves considerably the pressure of time.

Referring now to FIGURE 13, there is shown a simplified form of a preferred comparator amplifier. This amplifier is more fully described and claimed in the co-pending application of John W. Gray, Serial No. 270,038, filed April 2, 1963, for "Comparator Amplifier," which application is assigned to the same assignee as is the instant application, and accordingly will be but briefly described herein. The summing point 53 is connected through a resistor 101 to a junction 102 which in turn is coupled by a capacitor 103 to a junction 104 connected to the base of a transistor 105 connected as an emitter-follower. The emitter of the transistor 105 is connected to a junction 106 which is coupled by a capacitor 107 to a junction 108. The emitter-follower provides a high input impedance which is increased by "bootstrapping" the emitter to the base by a capacitor 109. Transistor switches 111, 112 and 113 are connected to selectively ground the junctions 53, 102 and 108 respectively.

The switches are normally closed but are opened at the time $t_0$ by the enabling gate (FIGURE 5). When the switches are closed, the potential of the junctions 53, 102 and 108 are substantially ground potential while the junctions 104 and 106 assume any potential dictated by the conductance of the transistor 105. The capacitors 103 and 107 are therefore charged. When the switches are opened, the summing point 53 assumes a potential determined by the relative sizes of $I_f$ and $I_s$ and this potential is passed substantially without change to the junctions 104 and 108. The capacitors 103 and 107 are large enough (on the order of 10 $\mu$f.) so that the potential across each does not change appreciably during the entire gate (which may be on the order of 50 $\mu$sec. duration) even though small base currents are drawn by the transistor 105 and the following transistor 115.

The potential of the junction 108 is amplified by emitter coupled transistors 115 and 116, and the output applied to a junction 117 by a transistor 118 connected as an emitter-follower. Since the potential of the summing point 53 may be several volts above or below ground, diodes 121 and 122 are connected as shown to limit the excursion of the collector of the transistor 116.

The potential of the junction 117 is amplified by three transistors 123, 124 and 125 connected in much the same way as the transistors 115, 116 and 118. The junction 117 is coupled by a large capacitor 126 to the base of the transistor 123 which is also connected to a transistor switch 127 operated in synchronism with the switches 111, 112 and 113. The output $e_0$ is taken from the emitter of the transistor 125.

The comparator amplifier of FIGURE 13 operates with virtually no delay since the switches 111, 112, 113 and 127 are open for the entire duration of the enabling gate. Consequently the entire period between $t_0$ and $t_1$, between $t_1$ and $t_2$, etc. is available for the operation of the logic circuit 33, the flip-flops F1–F9, the diode matrix 34, the switches 41–48, and the exponential interpolator 64.

In summary, the present invention converts an analog input directly to a logarithmic digital output, instead of performing the linear to logarithmic conversion and the an analog to digital conversion separately. Serial output is available during the gate from the output flip-flop 57. Additionally, the output is stored in the register flip-flops F1–F9 and is available after passage of the gate. The conversion process is one of successive approximations in which a binary number is placed in the register and converted to an exponential analog form which is then compared with the analog input, and a new binary number tried. This process involves two digital to analog converters, the first comprising the first three flip-flops and their associated circuitry which generate a current and the second comprising the exponential interpolator which, in the first instance, generates an analog voltage. An important feature of the invention is the exponential interpolator which is much less complex than would be an extension of the resistors R1–R8 to 512 resistors and yet at the same time is little or no more complex than would be a linear interpolator. Although additional resistors are used, only one switch is required for each stage.

Although a preferred embodiment of the invention has been described in considerable detail for illustrative purposes, many modifications will occur to those skilled in the art. It is therefore desired that the protection afforded by Letters Patent be limited only by the true scope of the appended claims.

What is claimed is:

1. A logarithmic analog to digital converter, comprising, a plurality of flip-flops constituting a register, means for setting said flip-flops successively from an initial reset condition, means responsive to the setting of each of the first of a predetermined number of said flip-flops for selecting one of a plurality of resistors, the number of said resistors being equal to the number of possible combinations of the conditions of said first predetermined number of flip-flops, each resistor so selected being connected to a voltage source, the values of said resistors being chosen to cause the current flowing therethrough to be indicative of an exponential function of the number indicated by said register, means responsive to the setting of each of the remainder of said flip-flops for varying the voltage of said source approximately in accordance with said exponential function, whereby the current through the selected resistor is varied, means for comparing the current through the currently selected resistor with a current proportional to the analog input as each flip-flop is set, and means operated by the result of each comparison for controlling the condition of the just previously set flip-flop.

2. Apparatus for producing a binary digital output indicative of a predetermined logarithmic function of an analog input voltage, comprising, means for producing a reference current proportional to said analog input voltage, a plurality of flip-flops constituting a register, means for setting said flip-flops successively from an initial reset condition, a plurality of resistors equal in number to the number of possible combinations of the conditions of the first of a predetermined number of said flip-flops, a voltage source, means responsive to the setting of each of said first predetermined number of flip-flops for connecting one of said resistors to said voltage source, only one of said resistors being connected to said source at any one time, the values of each of said resistors being selected so that the current flowing therethrough when so connected is indicative of an exponential function of the number then indicated by said register, means responsive to the setting of each of the remainder of said flip-flops for varying the voltage of said source approximately in accordance with said exponential function, whereby the current through the selected resistor is varied, means for comparing the current flowing through the currently selected resistor with said reference current as each flip-flop is set, and means operated by the result of each comparison for controlling the condition of the just previously set flip-flop.

3. Voltage varying apparatus, comprising, a source of constant voltage, an output conductor, a plurality of pairs of resistors, each pair serially connected between said output conductor and said source, and a plurality of switch means, each for selectively grounding one of the junctions between the resistors constituting said pairs.

4. Voltage varying apparatus, comprising,
a source of constant voltage,
an output conductor,
a plurality of pairs of serially connected resistors,
each pair comprising a first resistor connected to said output conductor and a second resistor connected to said source,
the values of said first resistors being related to each other by a geometric progression,
the values of said second resistors being related to each other by a geometric progression, and
a plurality of switch means, each for selectively grounding one of the junctions between said first and second resistors.

5. Apparatus for generating a voltage the magnitude of which is approximately an exponential function of a digital number input, comprising,
a source of constant voltage,
an output conductor,
a common conductor,
a plurality of pairs of resistors,
each pair being serially connected between said source and said output conductor,
the connection between the two resistors of each pair defining a junction,
a plurality of flip-flops,
means for controlling the condition of said flip-flops in accordance with said digital input, and
means controlled by each of said flip-flops for connecting one of said junctions to said common conductor.

6. An exponential binary digital to analog converter, comprising,
a first conductor,
a source of constant voltage connected to said first conductor,
an output conductor,
a ground conductor,
a series of conductive paths connected in parallel with each other between said first and said output conductors,
each of said paths comprising first and second serially connected resistors,
said first resistors varying in magnitude from one path to the next in a geometric progression in which the multiplication factor is two,
said second resistors also varying in magnitude from one path to the next in a geometric progression in which the multiplication factor is also two, and
a plurality of switch means, one for each path, each for selectively connecting one of the junctions of said first and second resistors to said ground conductor,
whereby selective operation of said switch means in accordance with a binary digital input causes the voltage of said output conductor to vary approximately as an exponential function of the binary digital input.

7. Apparatus for generating a voltage the magnitude of which is approximately an exponential function of a digital number input, comprising,
a source of constant voltage,
an output conductor,
a common conductor,
a plurality of pairs of resistors, each pair comprising first and second serially connected resistors,
each pair being serially connected between said output conductor and said source,
the connection between each of said first and second resistors defining a junction,
the values of said first resistors being related to each other by a geometric progression the multiplication factor of which is two,
the values of said second resistors also being related to each other by a geometric progression the multiplication factor of which is also two,
the value of each second resistor being related to that of its corresponding first resistor of the same pair by the same common factor,
a plurality of flip-flops,
means for controlling the condition of said flip-flops in accordance with said digital input, and
means controlled by each of said flip-flops for connecting one of said junctions to said common conductor.

8. Apparatus for generating a voltage the magnitude of which is approximately an exponential function of a binary digital input, comprising,
a source of constant voltage,
an output conductor,
a common conductor,
a plurality of pairs of resistors,
each pair comprising first and second serially connected resistors,
each pair being serially connected between said output conductor and said source,
the connection between each of said first and second resistors defining a junction,
the values of said first resistors being related to each other by a geometric progression of the multiplication factor of which is two,
the values of said second resistors also being related to each other by a geometric progression the multiplication factor of which is also two,
the value of each second resistor being related to that of its corresponding first resistor of the same pair by a common factor,
an auxiliary resistor connected between said output conductor and said source,
a plurality of flip-flops, one for each pair of resistors,
each flip-flop being controllable to indicate either the binary one or the binary zero, and
a plurality of switch means, one for each flip-flop, each for connecting one of said junctions to said common conductor when the corresponding flip-flop indicates zero.

References Cited by the Examiner

IBM Technical Disclosure Bulletins, vol. 2, No. 1, page 36, June 1959, and vol. 2, No. 4, pages 137–138, December 1959.

MALCOLM A. MORRISON, *Primary Examiner.*

K. R. STEVENS, J. F. MILLER, *Assistant Examiners.*